US005742472A

United States Patent [19]

Lee et al.

[11] Patent Number: 5,742,472

[45] Date of Patent: Apr. 21, 1998

[54] STACKED CAPACITORS FOR INTEGRATED CIRCUIT DEVICES AND RELATED METHODS

[75] Inventors: Myoung-bum Lee; Hyeon-deok Lee, both of Seoul, Rep. of Korea

[73] Assignee: Samsung Electronics Co., Ltd., Suwon, Rep. of Korea

[21] Appl. No.: 674,883

[22] Filed: Jul. 3, 1996

[30] Foreign Application Priority Data

Jul. 13, 1995 [KR] Rep. of Korea .................... 95-20635

[51] Int. Cl.$^{6}$ .................... H01G 4/06

[52] U.S. Cl. .................... 361/321.4; 361/313; 361/321.5; 257/306; 257/308; 257/309; 438/387; 438/396; 438/397

[58] Field of Search .................... 257/301–306, 257/308–311; 361/320–322, 311–313; 437/60; 438/386–387, 396–399

[56] References Cited

U.S. PATENT DOCUMENTS 5,583,068 12/1996 Jones, Jr. et al. .................... 437/52

5,583,360 12/1996 Roth et al. .................... 257/316

OTHER PUBLICATIONS

Yamaguchi et al., *Structural and Electrical Characterization of $SrTiO_3$ Thin Films Prepared by Metal Organic Chemical Vapor Deposition*, Jpn. J. Appl. Phys., vol. 32, Part 1, No. 9B, Sep. 1993, pp. 4069–4073.

*Primary Examiner*—Bot L. Ledynh

*Attorney, Agent, or Firm*—Myers, Bigel, Sibley & Sajovec

[57] ABSTRACT

A method for fabricating a capacitor on a substrate includes the steps of forming an insulating layer on the substrate, and forming the first plate electrode on the insulating layer. A first dielectric layer is then formed on the plate electrode, and a first common storage electrode is formed on the first dielectric layer. A contact hole is then formed through the insulating layer, the first plate electrode, the first dielectric layer, and the first common storage electrode, thereby exposing a predetermined portion of the substrate. A first spacer is formed on a sidewall of the contact hole, and a conductive plug is formed in the contact hole extending from the substrate to the first common storage electrode.

28 Claims, 2 Drawing Sheets

STACKED CAPACITORS FOR INTEGRATED CIRCUIT DEVICES AND RELATED METHODS

FIELD OF THE INVENTION

The present invention relates to integrated circuit devices and more particularly to capacitors for integrated circuit devices.

BACKGROUND OF THE INVENTION

As dynamic random access memories (DRAMs) have become more highly integrated, the size of individual electronic devices within memories have decreased. In particular, the space available for the capacitor of a memory cell in a dynamic random access memory is steadily decreasing. Accordingly, there is a need to increase the capacitance per unit area of capacitors used for DRAM memory cells. In the past, the capacitance per unit area has been increased by: (1) reducing the thickness of the dielectric layer; (2) increasing an effective area of the capacitor; and/or (3) using dielectric materials having a high dielectric constant.

When reducing the thickness of the dielectric layer, the gains which can be achieved in the capacitance per unit area may be limited by the reliability of the thin dielectric layer. In particular, a conventional dielectric layer of less than about 100Å thick may have a reduced reliability because of the Fowler-Nordheim tunneling current. In order to increase an effective area of a capacitor, the capacitor is generally manufactured with a three-dimensional structure. The three-dimensional structure, however, may complicate the manufacturing process and increase the costs of the memory device.

Recently, the dielectric constant of the dielectric layer used in capacitors has been increased by using ferroelectric materials having a perovskite structure. Exemplary ferroelectric materials include PZT ($PbZrTiO_3$) and BST ($BaSrTiO_3$). By using a ferroelectric material, the capacitance of a stacked capacitor can be increased significantly. Accordingly, a high capacitance capacitor can be fabricated without requiring a three-dimensional structure.

Unlike conventional dielectric materials such as silicon dioxide, silicon nitride, or tantalum pentoxide ($Ta_2O_5$), ferroelectric materials polarize spontaneously and may have a dielectric constant on the order of about 200 to 1000. When a ferroelectric material is used to form the dielectric layer of a capacitor, the dielectric layer can have a thickness on the order of several hundred Å and can provide a per unit area capacitance equivalent to that provided by an oxide layer with a thickness of not more than 10Å. It has been recently reported that a layer of STO ($SrTiO_3$) has been used as the dielectric layer in the capacitors for a 64-megabit DRAM. See Yamaguchi et al., "Structural and Electrical Characterization of $SrTiO_3$ Thin Film Prepared by Metal Organic Chemical Vapor Deposition", JJAP, Vol. 32, Part 1, No. 913, pp. 4069–4073 (1993). When the dielectric layer of a capacitor is formed using a material having a high dielectric constant, the material chosen for the capacitor electrodes should meet the following requirements: (1) the electrode material supports the formation of the perovskite structure; (2) a dielectric layer having a low dielectric constant does not form on the electrode material at the interface with the ferroelectric material; (3) the electrode material prevents the diffusion of silicon and the ferroelectric material into one another; and (4) the electrode material is relatively easy to pattern.

Accordingly, polysilicon should generally not be used for a storage or plate electrode when the dielectric layer is formed from a ferroelectric material. This is because a polysilicon layer may be oxidized by the ferroelectric material thereby forming a silicon dioxide layer having a relatively low dielectric constant. Accordingly, the capacitor electrode should be formed from a noble metal such as platinum (Pt) which does not oxidize when placed in contact with the ferroelectric material.

Accordingly, when a ferroelectric material such as PZT or BST is used to form the dielectric layer, platinum is the most commonly used electrode material. Where the platinum contacts polysilicon, however, an area of the platinum layer contacting the polysilicon may be silicidated. In other words, silicon may be diffused into the platinum electrode and may therefore influence the properties of the dielectric layer. A diffusion blocking layer may thus be required to prevent silicon from diffusing into the electrode.

A diffusion blocking layer such as titanium nitride (TiN) layer, however, may be oxidized in the succeeding step of depositing the dielectric layer formed of the ferroelectric material. As before, this oxide layer may have a relatively low dielectric constant thus reducing the performance of the capacitor.

SUMMARY OF THE INVENTION

It is therefore an object of the present invention to provide improved capacitor structures and methods.

This and other objects are provided according to the present invention by a method for forming a capacitor on a substrate including the steps of forming an insulating layer on the substrate and forming a first plate electrode on the insulating layer. A first dielectric layer is formed on the plate electrode and a first common storage electrode is formed on the first dielectric layer. A contact hole is then formed through the insulating layer, the first plate electrode, the first dielectric layer, and the first common storage electrode thereby exposing a predetermined portion of the substrate. A first spacer is formed on a sidewall of the contact hole and a conductive plug is formed in the contact hole extending from the substrate to the first common storage electrode. In the capacitor thus formed, the common storage electrode can be electrically connected to the substrate through the conductive plug. This capacitor can thus be used advantageously in a memory cell of a dynamic random access memory.

In addition, the first dielectric layer, and the common storage electrode can be patterned to form a mesa structure. By forming a spacer along a sidewall of the mesa structure, forming a second dielectric layer extending over the common storage electrode and the spacer, and forming a second plate electrode on the second dielectric layer, a second capacitor can be stacked on the first capacitor. Such a structure thus increases the per unit area capacitance of the capacitor.

Preferably, the first dielectric layer comprises a layer of a ferroelectric material having a perovskite structure. Such a material provides a high dielectric constant further increasing the capacitance per unit area. In particular, the ferroelectric material can be chosen from the group consisting of $PbZrTiO_3$ and $BaSrTiO_3$. When using the ferroelectric material, the method may include the step of forming a titanium layer between the first plate electrode and the first dielectric layer. This barrier layer may promote adhesion between these two layers.

A capacitor formed according to the methods described above can have increased capacitance per unit area. In particular, the use of a ferroelectric material having a perovskite structure can be used to increase the performance of a dielectric layer. In addition, the stacked structure providing plate electrodes both above and below common storage electrodes further increases the capacitance per unit area. Accordingly, capacitors fabricated as discussed above can be advantageously used in highly integrated dynamic random access memories.

DETAILED DESCRIPTION

Figure 1:
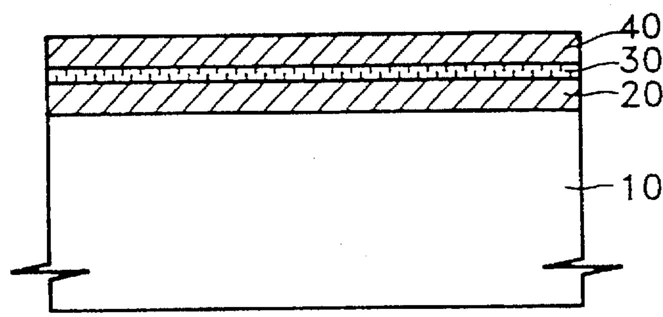
FIGS. 1–6 are cross-sectional views illustrating a capacitor according to the present invention, during intermediate fabrication steps.
Figure 2:
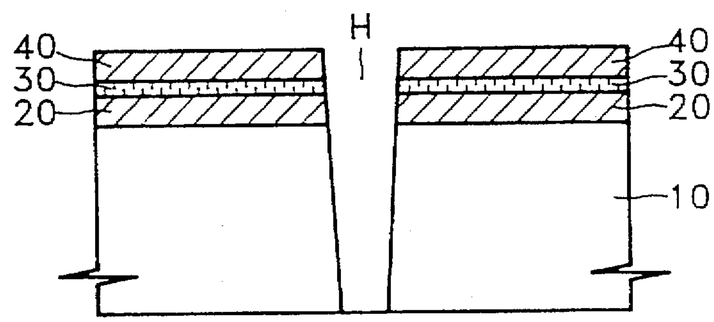

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

In FIG. 1, a first plate electrode 20, a first dielectric layer 30, and a first common storage electrode 40 are sequentially deposited on an insulating layer 10. The plate electrode 20 and the storage electrode 40, which are separated by the dielectric layer 30, together define a capacitor. More specifically, the insulating layer 10 is formed on a semiconductor substrate. The semiconductor substrate includes transistors, and the insulating layer planarizes the substrate and insulates the substrate from the capacitor structure. The insulating layer 10 may be formed from ozone ($O_3$)-TEOS which is deposited across the surface of the substrate. The electrodes 20 and 40 are preferably formed from a non-oxidative noble metal such as platinum (Pt).

The first dielectric layer 30 is preferably a material of a perovskite structure having a high dielectric constant, such as PZT or BST. This dielectric layer can be deposited by a reactive sputtering method under an oxygen ambient, or deposited by a metal organic chemical vapor deposition (MOCVD) method in which an organic metal source is used. In addition, a thin titanium (Ti) layer can be formed at the interface between the insulating layer 10 and the first plate electrode 20 to promote adhesion therebetween.

A contact hole H is formed in the insulating layer 10, the first plate electrode 20, the dielectric layer 30, and the first common storage electrode 40 thereby exposing a portion of the substrate. The contact hole H is formed by etching the first common storage electrode 40, the first dielectric layer 30, the first plate electrode 20, and the interlayer dielectric layer 10. The contact hole H thus exposes a predetermined portion of the substrate, such as the source region of a transistor.

Figure 3:
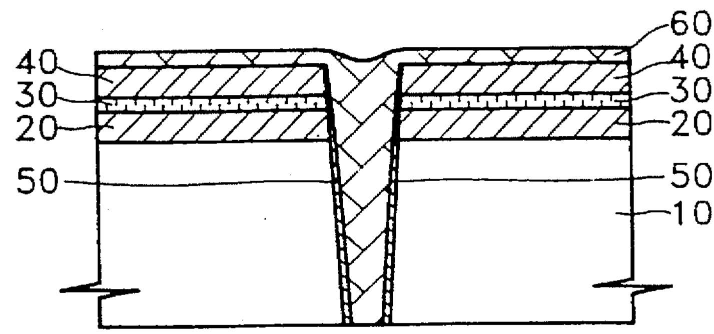

As shown in FIG. 3, a first spacer 50 is formed on the sidewalls of the contact hole H, and a polysilicon layer 60 is formed across the first common storage electrode and fills the contact hole H. The polysilicon layer 60 thus forms a plug filling the contact hole and making electrical contact with the exposed portion of the substrate. The polysilicon layer 60 also forms a second common storage electrode on the first common storage electrode 40. The spacer 50 insulates the polysilicon plug from the first plate electrode 20.

The first spacer 50 is formed on the sidewalls of the open contact hole, and the conductive layer 60 is preferably formed from a conductive material such as doped polysilicon. The doped polysilicon can be deposited on the structure and then etched back. Accordingly, the polysilicon layer formed on the first common storage electrode 40 can be used as a second common storage electrode. In addition, a titanium nitride (TiN) barrier layer can be formed at the interface between the first and second common storage electrodes 40 and 60 thereby preventing the silicidation of platinum (Pt) forming the first common storage electrode 40 and polysilicon constituting the second common storage electrode 60.

Figure 4:
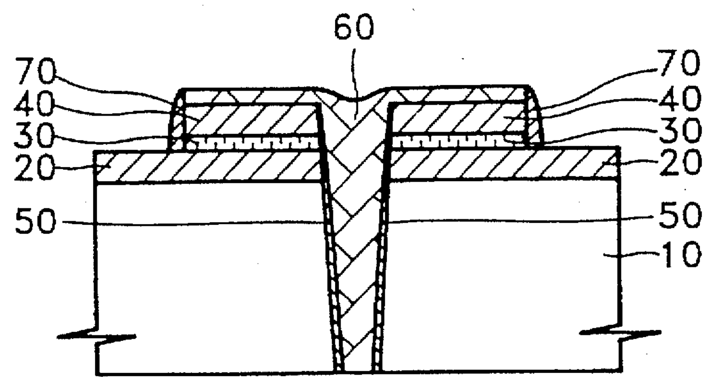

In FIG. 4, the polysilicon layer 60, the first common storage electrode 40, and the dielectric layer 30 are patterned thus forming a mesa structure, and a second spacer 70 is formed along the sidewalls of the mesa thus formed. The second spacer 70 insulates the common storage electrodes 40 and 60 from a second plate electrode which is formed as discussed below. First and second common storage electrodes 40 and 60 thus form a storage node.

Figure 5:
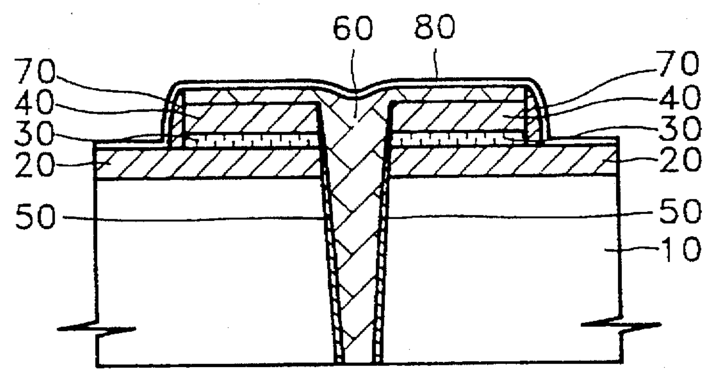

In FIG. 5, a second dielectric layer 80 is formed across the second common storage electrode 60, the spacer 70, and exposed portions of the first plate electrode 20. This second dielectric layer 80 can be formed from a material having a high dielectric constant such as BST or STO. These materials can also be used for the first dielectric layer 30. In addition, materials such as $Ta_2O_5$, $Si_3N_4$, or oxide/nitride/oxide (ONO) can be used for the second dielectric layer 80.

Figure 6:
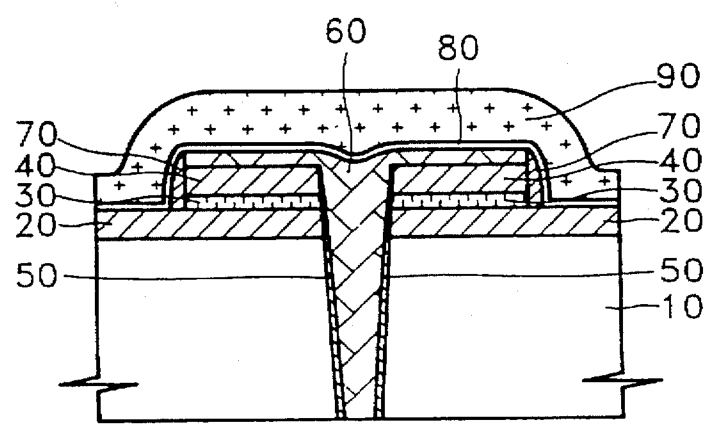

In FIG. 6, a second plate electrode 90 is deposited on the second dielectric layer 80. Accordingly, a second capacitor is defined by the second common storage electrode 60, the second dielectric layer 80, and the second plate electrode 90.

In a capacitor formed according to the method described above, the first plate electrode is formed prior to the formation of the storage electrode thereby reducing defects in the storage electrode created at the time the dielectric layer is deposited. In addition, a stacked capacitor having a double capacitor structure in which two capacitors are stacked can be manufactured by using a common storage electrode for a common electrode of the first and second capacitors thereby increasing the per unit area capacitance of the capacitor.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method for fabricating a capacitor on a semiconductor substrate, said method comprising the steps of:

forming an insulating layer on the semiconductor substrate;

forming a first plate electrode on said insulating layer;

forming a first dielectric layer on said plate electrode;

forming a first common storage electrode on said first dielectric layer;

forming a contact hole through said insulating layer, said first plate electrode, said first dielectric layer, and said first common storage electrode thereby exposing a predetermined portion of the substrate;

forming a first spacer on a sidewall of said contact hole;

forming a conductive polysilicon plug in said contact hole extending from the substrate to said first common storage electrode;

forming a second common storage electrode on said conductive polysilicon plug and on said first common storage electrode wherein said second common storage electrode is formed from polysilicon;

patterning said first dielectric layer, said first common storage electrode, and said second common storage electrode to form a mesa structure;

forming a second spacer along a sidewall of said mesa structure;

forming a second dielectric layer extending over said second common storage electrode and said second spacer to an exposed portion of said first plate electrode; and forming a second plate electrode on said second dielectric layer opposite said second common storage electrode.

2. A method according to claim 1 wherein said first plate electrode and said first common storage electrode each comprise a layer of a noble metal.

3. A method according to claim 1 further comprising the step of forming a titanium layer between said first plate electrode and said first dielectric layer.

4. A method according to claim 1 wherein said first dielectric layer comprises a layer of a ferroelectric material having a perovskite structure.

5. A method according to claim 4 wherein said ferroelectric material is selected from the group consisting of $PbZrTiO_3$ and $BaSrTiO_3$.

6. A method according to claim 1 further comprising the step of forming a TiN barrier layer between said first common storage electrode and said second common storage electrode.

7. A method according to claim 1 wherein said second dielectric layer comprises a layer of a material selected from the group consisting of $Ta_2O_5$, $Si_3N_4$, and oxide/nitride/oxide (ONO).

8. A capacitor on a substrate, said capacitor comprising:

a patterned insulating layer on the substrate, said patterned insulating layer defining an opening therethrough;

a first patterned plate electrode on said insulating layer, said first patterned plate electrode defining an opening therethrough coincident with said patterned insulator opening;

a first dielectric layer on said plate electrode, said first dielectric layer defining an opening therethrough coincident with said patterned insulator opening and said first patterned plate electrode opening;

a first common storage electrode on said first dielectric layer, said first common storage electrode defining an opening therethrough coincident with said patterned insulator opening, said first patterned plate electrode opening, and said first dielectric layer opening so that said plurality of openings define a contact hole exposing a portion of said substrate;

a first spacer on a sidewall of the contact hole;

a conductive plug in said contact hole extending from the substrate to said first common storage electrode;

a second common storage electrode on said conductive plug and on said first common storage electrode;

a second dielectric layer on said second common storage electrode; and a second plate electrode on said second dielectric layer opposite said second common storage electrode.

9. A capacitor according to claim 8 wherein each of said conductive plug and said second common storage electrode are each formed from polysilicon.

10. A capacitor according to claim 8 wherein said dielectric layer, said first common storage electrode, and said second common storage electrode together define a three layer mesa structure.

11. A capacitor according to claim 10 further comprising a second spacer along a sidewall of said mesa structure.

12. A capacitor according to claim 11 wherein said second dielectric layer extends over said second common storage electrode and said second spacer to an exposed portion of said first plate electrode.

13. A capacitor according to claim 12 wherein said second dielectric layer comprises a layer of a material selected from the group consisting of $TaO_5$, $Si_3N_4$, and oxide/nitride/oxide (ONO).

14. A capacitor according to claim 8 further comprising a TiN barrier layer between said first common storage electrode and said second common storage electrode.

15. A capacitor according to claim 8 wherein said first plate electrode and said first common storage electrode each comprise a layer of a noble metal.

16. A capacitor according to claim 8 wherein said first dielectric layer comprises a layer of a ferroelectric material having a perovskite structure.

17. A capacitor according to claim 16 wherein said ferroelectric material is selected from the group consisting of $PbZrTiO_3$ and $BaSrTiO_3$.

18. A capacitor on a substrate, said capacitor comprising:

a patterned insulating layer on the substrate, said patterned insulating layer defining an opening therethrough;

a first patterned plate electrode on said insulating layer, said first patterned plate electrode defining an opening therethrough coincident with said patterned insulator opening;

a first dielectric layer on said plate electrode, said first dielectric layer defining an opening therethrough coincident with said patterned insulator opening and said first patterned plate electrode opening;

a first common storage electrode on said first dielectric layer, said first common storage electrode defining an opening therethrough coincident with said patterned insulator opening, said first patterned plate electrode opening, and said first dielectric layer opening so that said plurality of openings define a contact hole exposing a portion of said substrate;

a first spacer on a sidewall of the contact hole;

a conductive plug in said contact hole extending from the substrate to said first common storage electrode; and a titanium layer between said first plate electrode and said first dielectric layer.

19. A method for fabricating a capacitor on a semiconductor substrate, said method comprising the steps of:

forming an insulating layer on the semiconductor substrate;

forming a first plate electrode on said insulating layer;

forming a first dielectric layer on said plate electrode;

forming a contact hole through said insulating layer, said first plate electrode, and said first dielectric layer, thereby exposing a predetermined portion of the substrate;

forming a first spacer on a sidewall of said contact hole;

forming a conductive plug on said first spacer in said contact hole extending from the substrate to a surface of said dielectric layer opposite said substrate;

forming a common storage electrode on said first dielectric layer electrically connected to said substrate through said conductive plug;

forming a second dielectric layer on said common storage electrode; and forming a second plate electrode on said second dielectric layer opposite said second common storage electrode.

20. A method according to claim 19 wherein said step of forming said common storage electrode comprises forming a first common storage electrode on said first dielectric layer, wherein said step of forming said contact hole comprises forming said contact hole through said first common storage electrode, and wherein said step of forming said second dielectric layer is preceded by the step of forming a second common storage electrode on said conductive plug and on said first common storage electrode.

21. A method according to claim 20 wherein said steps of forming said first dielectric layer, forming said first common storage electrode, and forming said second common storage electrode are followed by the step of patterning said first dielectric layer, said first common storage electrode, and said second common storage electrode to form a mesa structure.

22. A method according to claim 21 wherein said patterning step is followed by the step of forming a second spacer along a sidewall of said mesa structure.

23. A method according to claim 19 further comprising the step of forming a titanium layer between said first plate electrode and said first dielectric layer.

24. A capacitor on a substrate, said capacitor comprising:

a patterned insulating layer on the substrate, said patterned insulating layer defining an opening therethrough;

a first patterned plate electrode on said insulating layer, said first patterned plate electrode defining an opening therethrough coincident with said patterned insulator opening;

a first dielectric layer on said plate electrode, said first dielectric layer defining an opening therethrough coincident with said patterned insulator opening and said first patterned plate electrode opening so that said plurality of openings define a contact hole exposing a portion of said substrate;

a first spacer on a sidewall of the contact hole;

a conductive plug in said contact hole extending from the substrate to a surface of said dielectric layer opposite said substrate;

a first common storage electrode on said first dielectric layer electrically connected to the substrate through said conductive plug;

a second dielectric layer on said common storage electrode; and a second plate electrode on said second dielectric layer opposite said common storage electrode.

25. A capacitor according to claim 24 wherein said common storage electrode comprises a first common storage electrode on said first dielectric layer, wherein said first common storage electrode defines an opening therein coincident with said plurality of openings, and further comprising a second common storage electrode on said conductive plug and on said first common storage electrode.

26. A capacitor according to claim 25 wherein said first dielectric layer, said first common storage electrode, and said second common storage electrode together define a three layer mesa structure.

27. A capacitor according to claim 26 further comprising a second spacer along a sidewall of said mesa structure.

28. A capacitor according to claim 24 further comprising a titanium layer between said first plate electrode and said first dielectric layer.

* * * * *